United States Patent [19]

Whitefoot

[11] Patent Number: 4,575,688

[45] Date of Patent: Mar. 11, 1986

[54] TRACKING OSCILLATORS

[76] Inventor: Alan D. Whitefoot, 7620 29th St. W., Tacoma, Wash. 98466

[21] Appl. No.: 726,668

[22] Filed: Apr. 24, 1985

[51] Int. Cl.[4] .............................................. H03B 21/01
[52] U.S. Cl. ........................................ 331/37; 331/40; 331/48; 331/55; 331/172; 331/177 R
[58] Field of Search ....................... 331/37, 40, 48, 55, 331/56, 172, 177 R; 84/1.07, 1.11, 1.19

[56] References Cited

U.S. PATENT DOCUMENTS 2,790,906  4/1957  Hammond .............................. 331/48

FOREIGN PATENT DOCUMENTS 0433286  8/1926  Fed. Rep. of Germany ........ 331/40

Primary Examiner—Eugene R. LaRoche
Assistant Examiner—D. C. Mis

[57] ABSTRACT

The output signal frequencies of two current controlled oscillators are made to track closely by matching timing currents with a current mirror. A frequency difference between the output signals is obtained by establishing an additional timing current for only one of said oscillators.

2 Claims, 7 Drawing Figures

TRACKING OSCILLATORS

The present invention relates to paired electronic oscillators whose frequencies of oscillation track closely, and furthermore, whose frequencies of oscillation can be made to differ by specific amounts.

Researchers studying the response of living organisms (particularly humans) to sound, sometimes use sounds which result in what are called binaural beats. Two sine wave electronic signals of audible frequency are amplified electronically so that a subject wearing headphones can listen to the corresponding sounds. The frequencies of the two sine wave signals are adjusted so that they differ by a small amount which will subsequently be referred to as the frequency difference. The subject will normally hear this frequency difference as a beat, when said frequency difference is in a range from 1 Hertz to 30 Hz.

Said binaural sine waves are usually obtained from two separate oscillators, adjusted manually to differ in frequency by the desired amount. This can be quite tedious and the adjustments have to be corrected frequently to compensate for oscillator drift.

Sine wave signals, as well as signals of other wave shapes, whose frequencies track closely are useful in electronic music and sound synthesis also.

SUMMARY OF THE INVENTION

The present invention provides two oscillators, both powered by the same power supply. The output signal frequencies of said oscillators can be varied simultaneously over a wide range. The frequency difference between said output signals can be adjusted independently from 0 to a relatively large value, and said frequency difference will be maintained as the output signal frequencies of said oscillators are varied. Furthermore, said frequency difference is stable over long periods of time.

Each of the oscillators provided by the present invention is a current controlled oscillator whose frequency of oscillation is directly proportional to an electrical current called the timing current. Said frequency of oscillation is inversely proportional to the value of a capacitor called the timing capacitor. The present invention is comprised of two such oscillators, a precision current mirror which causes at least a portion of the timing currents of said oscillators to track accurately, a variable resistance means which provides adjustment of the currents in the current mirror, and a variable resistance means which provides adjustment of an additional timing current to only one of the oscillators thereby providing means of adjusting the frequency difference.

While the aforementioned application required audio frequency sine waves, the present invention can provide other waveforms, such as triangle, square, sawtooth and pulse waveforms, and output frequencies can be provided well below audibility and well above audibility.

It is thus an object of the present invention to provide two well matched oscillators whose output signal frequencies can be varied simultaneously while a desired frequency difference is maintained between said output signal frequencies.

It is a further object of the present invention to provide such oscillators with a means for adjusting said frequency difference.

It is a further object of the present invention to provide such oscillators which provide signals whose frequency difference is stable over relatively long periods of time.

Further objects and advantages of the present invention will become apparent from a consideration of the drawings and ensuing description.

DETAILED DESCRIPTION OF THE INVENTION

Figure 1:
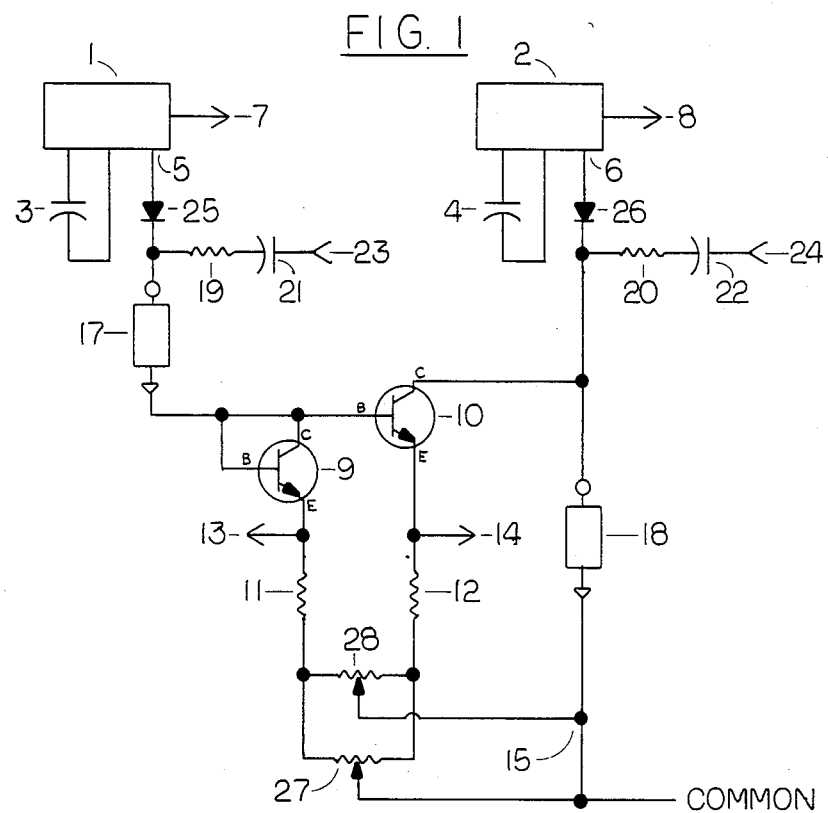
FIG. 1 is a circuit diagram showing a preferred embodiment of the invention.

FIG. 1 shows a somewhat generalized circuit diagram of the invention. For clarity, a direct current power supply needed for operation of said circuit, but not essential to the discussion, is not shown. Also not essential to the discussion, and therefore not shown in FIG. 1, are details and connections of the current controlled oscillators 1 and 2.

Oscillator 1 generates a sine wave signal, available at output connection 7, the frequency of which is inversely proportional to timing capacitor 3 and directly proportional to the timing current flowing from connection 5. A constant voltage is present at connection 5 so that the timing current for oscillator 1 is determined by the electrical resistance present between connection 5 and common connection 15.

Oscillator 2 is identical to oscillator 1. The output frequency of oscillator 2 depends on timing capacitor 4 and the timing current flowing from connection 6. There is a constant voltage present at connection 6 so that the timing current for oscillator 2 is determined by the electrical resistance present between connection 6 and common connection 15.

Diodes 25 and 26 prevent current from flowing into connections 5 and 6, respectively, in the event of a malfunction of circuitry external to the oscillators 1 and 2. Diodes 25 and 26 are not necessary for operation of the circuit. Diode 25 can be replaced by a direct connection from 5 to the junction of resistor 19 and variable resistance means 17. Diode 26 can be replaced by a direct connection from 6 to the junction of resistor 20, variable resistance means 18, and the collector terminal of transistor 10.

Resistor 19 and capacitor 21 allow an external signal to frequency modulate the timing current of oscillator 1. Resistor 20 and capacitor 22 allow an external signal to frequency modulate the timing current of oscillator 2. Said frequency modulation connections are not essential to understanding the invention, but illustrate a typical feature of current controlled oscillators which can be used in the invention.

Common connection 15 connects to the power supply not shown, in addition to the connections shown in FIG. 1. Terminal 5 of oscillator 1 connects through diode 25, variable resistance means 17, transistor 9, resistor 11, and potentiometers 27 and 28, to common connection 15. Terminal 6 of oscillator 2 connects through diode 26, transistor 10, resistor 12, and potentiometers 27 and 28 to common connection 15. Terminal 6 of oscillator 2 also connects to common 15 through diode 26 and variable resistance means 18.

Timing capacitors 3 and 4 are selected to match closely in value. Transistors 9 and 10 are a matched pair contained in the same package. Transistors 9 and 10, resistors 11 and 12, and potentiometers 27 and 28 comprise a precision current mirror. Due to basic transistor properties, the current flowing into the base and collector of diode connected transistor 9 will be closely tracked by the current flowing into the collector of transistor 10. Said currents can be made equal by adjusting potentiometer 27 and/or potentiometer 28 to compensate for mismatching of circuit elements. Potentiometer 27 is used as an internal calibration trimmer while potentiometer 28 is a front panel control.

Variable resistance means 17 adjusts the timing current for oscillator 1. Resistor 11 limits said timing current when variable resistance means 17 is at minimum value. Resistor 12 is equal to resistor 11. The oscillator 1 timing current flowing into the base and collector of diode connected transistor 9 is closely tracked by the oscillator 2 timing current flowing into the collector of transistor 10. Thus, as the value of variable resistance means 17 is changed, the output signal frequencies of both oscillators change simultaneously.

Variable resistance means 18 causes an additional timing current to flow from terminal 6 of oscillator 2, so that oscillator 2 can be adjusted to oscillate at a higher frequency than oscillator 1. If variable resistance means 18 is equal to infinity, oscillators 1 and 2 will oscillate at the same frequency, once potentiometer 27 and/or potentiometer 28 have been properly adjusted. The frequency difference between oscillator 2 and oscillator 1 is directly proportional to the additional oscillator 2 timing current determined by variable resistance means 18, and said additional oscillator 2 timing current is not affected by changes in variable resistance means 17. Thus, the output frequencies of oscillators 1 and 2 can be varied simultaneously with variable resistance means 17 while maintaining a frequency difference determined by variable resistance means 18. Said frequency difference is stable for relatively long periods of time since temperature and power supply voltage variations will normally affect both oscillators 1 and 2 nearly equally.

Prototypes have been built utilizing the readily available Exar XR2206 integrated circuit oscillators and National Semiconductor LM394 matched transistor pairs. Tracking within less than ¼ Hz over a range from 10 Hz to 2000 Hz has been achieved with parts selected to match. Frequency difference has been made adjustable from 0 to 500 Hz and has been stable for periods of several months. Different frequency ranges are obtained by choosing appropriate timing capacitor values. The XR2206 can also produce triangle and square waveforms. Other current controlled oscillators can produce other waveforms including sawtooth and pulse waveforms. Notice that superior performance can probably be achieved if both oscillators and the current mirror were contained in the same integrated circuit.

Figure 2:
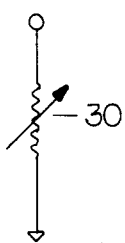
FIG. 2 shows a variable resistor which can be used in the circuit of FIG. 1.

FIG. 2 shows a variable resistor 30 which can be used as variable resistance means 17 in the circuit of FIG. 1. Variable resistor 30 can also be used as variable resistance means 18 in the circuit of FIG. 1.

Figure 3:
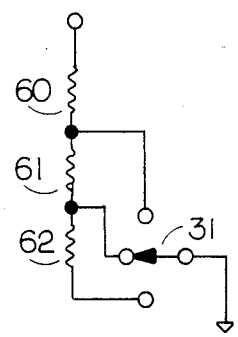
FIG. 3 shows a resistor and switch network which can be used in the circuit of FIG. 1.

FIG. 3 shows a resistor and switch network which can be used as variable resistance means 17 in the circuit of FIG. 1. The network of FIG. 3 can also be used as variable resistance means 18 in the circuit of FIG. 1.

Figure 4:
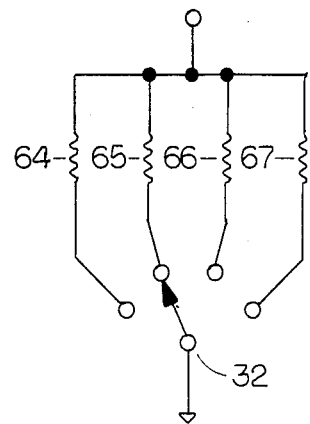
FIG. 4 shows a resistor and switch network which can be used in the circuit of FIG. 1.

FIG. 4 shows a resistor and switch network which can be used as variable resistance means 17 in the circuit of FIG. 1. The network of FIG. 4 can also be used as variable resistance means 18 in the circuit of FIG. 1.

Figure 5:
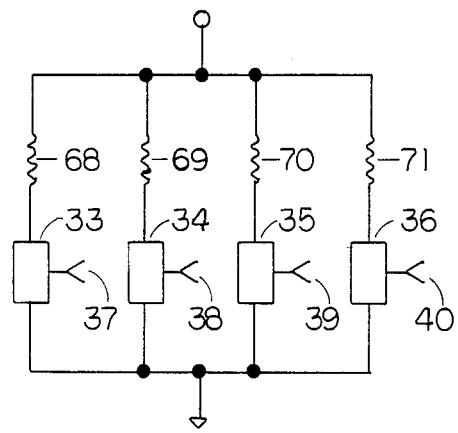
FIG. 5 shows a resistor and switch network which can be used in the circuit of FIG. 1.

FIG. 5 shows a resistor and switch network which can be used as variable resistance means 17 in the circuit of FIG. 1. The network of FIG. 5 can also be used as variable resistance means 18 in the circuit of FIG. 1. Switches 33, 34, 35 and 36 of FIG. 5 can be electromechanical relays or electronic switches such as JFET analog switches of CMOS bilateral switches. Switches 33, 34, 35 and 36 have control inputs 37, 38, 39 and 40 respectively, which accept digital signals that cause said switches to open or close.

Figure 6:
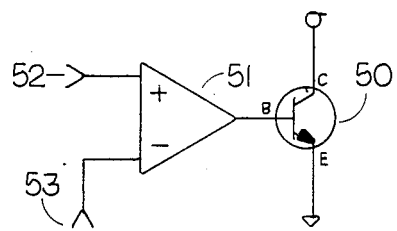
FIG. 6 shows a circuit employing a variable resistance means which can be used in the circuit of FIG. 1.

FIG. 6 shows a circuit in which a transistor 50 can be used as variable resistance means 17 in FIG. 1. Inverting input 53 or operational amplifier 51 connects to circuit junction 13 of the circuit of FIG. 1. The voltage at junction 13, with respect to common connection 15, is directly proportional to the timing current of oscillator 1, and when said voltage is fed back to inverting input 53 of operational amplifier 51, the timing current of oscillator 1 is regulated to a constant value determined by the voltage present at non-inverting input 52 of operational amplifier 51. Thus, the output signal frequencies of oscillators 1 and 2 will be linear functions of the voltage applied to non-inverting input 52 of operational amplifier 51. Said voltage can be applied to non-inverting input 52 by any of several means such as linear potentiometer or a digital to analog converter. The voltage applied to non-inverting input 52 can also be frequency modulated, in which case the output signal frequencies of oscillators 1 and 2 of FIG. 1 will be simultaneously frequency modulated while maintaining a desired frequency difference. Notice that feedback to inverting input 53 of operational amplifier 51 can also be taken from circuit junction 14 of FIG. 1, or alternatively, said feedback can be taken from both circuit junction 13 and circuit junction 14 by means of resistors not shown.

Figure 7:
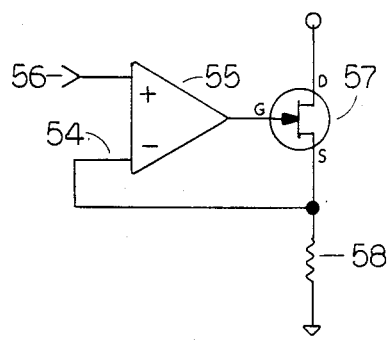
FIG. 7 shows a circuit employing a variable resistance means which can be used in the circuit of FIG. 1.

FIG. 7 shows a circuit in which an NFET 57 can be used as variable resistance means 18 in the circuit of FIG. 1. The voltage developed across resistor 58 is fed back to the inverting input 54 of operational amplifier 55, causing the current through NFET 57 to be regulated to a constant value, said regulated current being directly proportional to a voltage applied to non-inverting input 56 of operational amplifier 55. Thus, the frequency difference between the output signals of oscillators 1 and 2 of FIG. 1 will be a linear function of a voltage applied to non-inverting input 56 of operational amplifier 55.

It should be appreciated that the above descriptions illustrate only a few representative circuit configurations which can be used as variable resistance means 17 or 18 in the circuit of FIG. 1. Notice also that other current controlled oscillator configurations can be used which differ from the specific embodiment shown in FIG. 1. Therefore, the above descriptions should not be considered restrictive since other specific embodiments can be realized which do not depart from the spirit of the invention. One such alternate embodiment comprises the circuit of FIG. 1 except that variable resistance means 18 is connected between oscillator 1 and common connection 15, such that the frequency difference is determined by establishing an additional timing current for oscillator 1, rather than oscillator 2.

Furthermore, the embodiment described herein can be modified to obtain frequency relationships other than those described above. For examples: in the circuit of FIG. 1, timing capacitors 3 and 4 can be of unequal values; resistors 11 and 12 can be of unequal values; and variable resistance means 17 and 18 can be controlled simultaneously so that the frequency difference is some function of one of the oscillator output frequencies.

The scope of the invention is indicated by the appended claims, rather than by the foregoing description.

What is claimed is:

1. An oscillator circuit comprising;
    two current controlled oscillators,
    current mirror circuitry which provides closely tracking timing currents for said current controlled oscillators,
    a variable resistance means which controls said tracking timing currents of said current controlled oscillators, and
    a variable resistance means which controls an additional timing current of only one of said current controlled oscillators.

2. An oscillator circuit as in claim 1 wherein said variable resistance means which controls said tracking timing currents includes means for frequency modulating said tracking timing currents.

* * * * *